(12) United States Patent
Sato et al.

(10) Patent No.: US 7,875,214 B2
(45) Date of Patent: Jan. 25, 2011

(54) ELECTROCONDUCTIVE COMPOSITION, METHOD FOR FORMING ELECTROCONDUCTIVE FILM, AND ELECTROCONDUCTIVE FILM

(75) Inventors: Nao Sato, Kanagawa (JP); Tsubasa Okuno, Kanagawa (JP); Kazunori Ishikawa, Kanagawa (JP)

(73) Assignee: The Yokohama Rubber Co., Ltd., Tokyo (JP)

(*) Notice: Subject to any disclaimer, the term of this patent is extended or adjusted under 35 U.S.C. 154(b) by 159 days.

(21) Appl. No.: 12/238,745

(22) Filed: Sep. 26, 2008

(65) Prior Publication Data

US 2009/0085015 A1 Apr. 2, 2009

(30) Foreign Application Priority Data

Oct. 2, 2007 (JP) .............................. 2007-258943

(51) Int. Cl.
- *H01B 1/08* (2006.01)
- *H01B 1/12* (2006.01)
- *B05D 5/12* (2006.01)

(52) U.S. Cl. ...................... 252/520.3; 427/58

(58) Field of Classification Search .............. 252/520.3; 427/58

See application file for complete search history.

(56) References Cited

U.S. PATENT DOCUMENTS

| 6,942,825 B2 | 9/2005 | Honda et al. |
| 7,429,341 B2 * | 9/2008 | Sato et al. ................. 252/520.3 |
| 2010/0021704 A1 * | 1/2010 | Yoon et al. ................. 428/209 |

FOREIGN PATENT DOCUMENTS

| JP | 2003-203522 A | 7/2003 |
| WO | WO-2006035908 | 4/2006 |
| WO | WO 2008/038976 | * 4/2008 |

OTHER PUBLICATIONS

English trans of JP 200-203522A.*

* cited by examiner

*Primary Examiner*—Mark Kopec
(74) *Attorney, Agent, or Firm*—Connolly Bove Lodge & Hutz LLP

(57) ABSTRACT

An electroconductive composition including silver oxide (A) and silver salt of a fatty acid (B) containing at least one hydroxy group is provided. The electroconductive composition is capable of forming an electroconductive film at a low temperature and in a short period. The electroconductive composition is capable of adequately forming an electroconductive film on a substrate having a low heat resistance.

14 Claims, No Drawings

ELECTROCONDUCTIVE COMPOSITION, METHOD FOR FORMING ELECTROCONDUCTIVE FILM, AND ELECTROCONDUCTIVE FILM

TECHNICAL FIELD

The present invention relates to an electroconductive composition, a method for forming an electroconductive film, and an electroconductive film.

BACKGROUND OF THE INVENTION

Various methods have been used in producing a circuit board. In one known method, an electroconductive composition is printed on a synthetic resin substrate such as a polyester film, for example, by screen printing to thereby form a predetermined circuit pattern, and an electroconductive film constituting the electroconductive circuit is formed by heat treating the printed circuit pattern. The electroconductive composition used in this method is, for example, a silver paste produced by adding a binder comprising a thermoplastic resin such as acrylic resin or vinyl acetate resin or a thermosetting resin such as epoxy resin or unsaturated polyester resin, an organic solvent, a curing agent, a catalyst, and the like to electroconductive particles such as silver particles, and kneading the mixture to prepare the silver paste.

For example, JP 2003-203522 A discloses "a silver compound paste comprising silver oxide in particle form and silver salt of a tertiary fatty acid".

SUMMARY OF THE INVENTION

However, the silver compound paste described in JP 2003-203522 which is the type to be baked at a low temperature requires a heat treatment at a temperature of at least 180° C. for at least 30 minutes for the formation of the electroconductive film.

Accordingly, formation of an electroconductive film on a substrate having a low heat resistance (for example, a polyethylene terephthalate (PET) film) has been difficult. In addition, such heat treatment requiring a long time also suffered from the problem of low productivity.

Accordingly, an object of the present invention is to provide an electroconductive composition which is capable of forming an electroconductive film at a low temperature and in a short period, and hence, which is capable of adequately forming an electroconductive film on a substrate having a low heat resistance, a method for forming an electroconductive composition using such electroconductive composition, and an electroconductive film formed by using such electroconductive composition.

MEANS TO SOLVE THE PROBLEMS

The inventors of the present invention conducted an intensive study to realize the object, and found that an electroconductive composition containing silver oxide and silver salt of a fatty acid is capable of forming an electroconductive film in a short time and at a low temperature, and hence, highly capable of forming an electroconductive film on a substrate having a low heat resistance. The inventors of the present invention completed the present invention on the bases of such findings. Accordingly, the present invention provides the following (1) to (16).

(1) An electroconductive composition comprising silver oxide (A) and silver salt of a fatty acid (B) containing at least one hydroxy group.

(2) The electroconductive composition according to (1) above wherein the silver salt of a fatty acid (B) contains at least two hydroxy groups.

(3) The electroconductive composition according to (1) or (2) above wherein molar ratio (A/B) of the molar number A (MOL A) of the silver oxide (A) to the molar number B (MOL B) of the silver salt of a fatty acid (B) is in the range of 2/1 to 25/1.

(4) The electroconductive composition according to any one of (1) to (3) above wherein the silver salt of a fatty acid (B) is a compound represented by any one of the following formulae (I) to (III):

[Chemical formula 1]

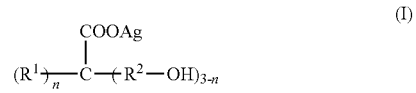

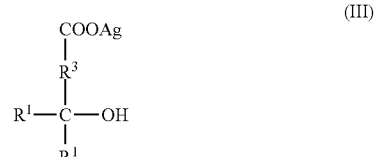

wherein, in formula (I), n represents an integer of 0 to 2, $R^1$ respectively represents hydrogen atom or an alkyl group containing 1 to 10 carbon atoms, and $R^2$ independently represents an alkylene group containing 1 to 6 carbon atoms, with the proviso that, when n is 0 or 1, the two or more $R^2$s may be either the same or different, and when n is 2, the $R^1$s may be either the same or different, in formula (II), $R^1$ independently represents hydrogen atom or an alkyl group containing 1 to 10 carbon atoms, and in formula (III), $R^1$ independently represents hydrogen atom or an alkyl group containing 1 to 10 carbon atom, and $R^3$ represents an alkylene group containing 1 to 6 carbon atoms.

(5) The electroconductive composition according to any one of (1) to (4) above wherein the silver salt of a fatty acid (B) is at least one member selected from silver 2,2-bis(hydroxymethyl)-n-butyrate, silver 2,2-bis(hydroxymethyl)propionate, and silver hydroxypivalate.

(6) The electroconductive composition according to any one of (1) to (5) above wherein the composition further comprises silver salt of a secondary fatty acid (C) having a boiling point of up to 200° C.

(7) The electroconductive composition according to (6) above wherein molar ratio (B/C) of the MOL B of the silver salt of a fatty acid (B) to the molar number C (MOL C) of the silver salt of a secondary fatty acid (C) is in the range of 1/1 to 15/1.

(8) The electroconductive composition according to (6) or (7) above wherein the silver salt of a secondary fatty acid (C) is a compound represented by the following formula (IV):

[chemical formula 2]

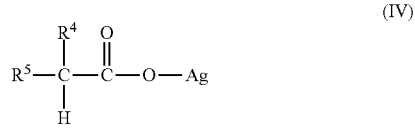

wherein R⁴ is an alkyl group containing 1 to 6 carbon atoms, and R⁵ is an alkyl group containing 1 to 10 carbon atoms.

(9) The electroconductive composition according to any one of (6) to (8) above wherein the silver salt of a secondary fatty acid (C) is silver 2-methylpropanoate and/or silver 2-methylbutanoate.

(10) The electroconductive composition according to any one of (1) to (9) above wherein the composition further comprises a polyesterurethane resin (D).

(11) The electroconductive composition according to (10) above wherein the polyesterurethane resin (D) has a glass transition temperature of at least 60° C.

(12) The electroconductive composition according to (10) or (11) above wherein the polyesterurethane resin (D) has an acid value of up to 30.

(13) The electroconductive composition according to any one of (10) to (12) above wherein content of the polyesterurethane resin (D) is in the range of 0.5 to 10 parts by weight in relation to the 100 parts by weight of the total content of the silver oxide (A), the silver salt of a fatty acid (B), and the silver salt of a secondary fatty acid (C).

(14) A method for forming an electroconductive film comprising the steps of coating the electroconductive composition of any one of (1) to (13) above on a substrate to form a coating, and subjecting the coating to a heat treatment to produce the electroconductive film.

(15) A method for forming an electroconductive film according to (14) above wherein the heat treatment is conducted by heating to a temperature of 100 to 250° C.

(16) An electroconductive film produced by the method for producing an electroconductive film of (14) or (15) above.

EFFECTS OF THE INVENTION

As will be described below, the present invention provides an electroconductive composition which is capable of forming an electroconductive film at a low temperature and in a short period, and hence, which is capable of adequately forming an electroconductive film on a substrate having a low heat resistance, a method for forming an electroconductive composition using such electroconductive composition, and an electroconductive film formed by using such electroconductive composition.

Use of the electroconductive composition of the present invention is very useful since it facilitates easy formation of a circuit such as electronic circuit and antenna on a substrate having a low heat resistance in a short time.

DETAILED DESCRIPTION OF THE INVENTION

The electroconductive composition of the present invention is an electroconductive composition containing silver oxide (A) and a silver salt of a fatty acid (B) having at least one hydroxyl group.

First, the silver oxide (A) and the silver salt of a fatty acid (B) are described.

<Silver Oxide (A)>

The silver oxide (A) used in the electroconductive composition of the present invention is silver oxide (I), namely, $Ag_2O$.

In the present invention, the silver oxide (A) used may be in any form, and preferably, in the form of particles having a particle size of up to 10 μm, and more preferably up to 1 μm. When the particle size is within such range, self reducing reaction occurs at a lower temperature, and as a consequence, the electroconductive film can be formed at a lower temperature.

<Silver Salt of a Fatty Acid (B)>

The silver salt of a fatty acid (B) used in the electroconductive composition of the present invention is a silver salt of a fatty acid having at least one hydroxy group, and more particularly, the one produced by reacting the fatty acid having at least one hydroxy group as described below with silver oxide.

The fatty acid used in the reaction as described above is not particularly limited as long as it is a fatty acid containing one or more hydroxy group, and preferably two or more hydroxy groups. Exemplary fatty acids include the compounds represented by the following formulae (1) to (3).

[Chemical formula 3]

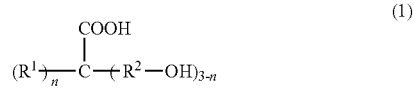

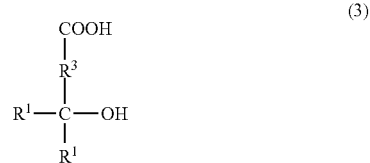

In the formula (1), n is an integer of 0 to 2, $R^1$ is hydrogen atom or an alkyl group containing 1 to 10 carbon atoms, and $R^2$ is an alkylene group containing 1 to 6 carbon atoms. When n is 0 or 1, the two or more $R^2$s may be either the same or different, and when n is 2, the two $R^1$s may be either the same or different.

In the formula (2), $R^1$ is independently hydrogen atom or an alkyl group containing 1 to 10 carbon atoms.

In the formula (3), $R^1$ is independently hydrogen atom or an alkyl group containing 1 to 10 carbon atoms, and $R^3$ is an alkylene group containing 1 to 6 carbon atoms.

In formulae (1) to (3), exemplary alkyl groups containing 1 to 10 carbon atoms of $R^1$ include methyl group, ethyl group, n-propyl group, n-butyl group, n-pentyl group, n-hexyl group, n-heptyl group, n-octyl group, n-nonyl group, and n-decyl group. Preferably, $R^1$ is hydrogen atom, methyl group, or ethyl group.

In formula (1), exemplary alkylene groups containing 1 to 6 carbon atoms of $R^2$ include methylene group, ethylene group, propane-1,3-diyl group, butane-1,4-diyl group, heptane-1,5-diyl group, and hexane-1,6-diyl group. $R^2$ is preferably methylene group or ethylene group. In formula (1), the integer of 0 to 2 for the n is preferably 1 or 2.

In formula (3), exemplary alkylene groups containing 1 to 6 carbon atoms of $R^3$ include methylene group, ethylene group, propane-1,3-diyl group, butane-1,4-diyl group, heptane-1,5-diyl group, and hexane-1,6-diyl group. $R^2$ is preferably methylene group or ethylene group.

Exemplary compounds represented by the formula (1) include 2,2-bis(hydroxymethyl)-n-butyric acid represented by the formula (1a), 2,2-bis(hydroxymethyl)propionic acid represented by the formula (1b), hydroxypivalic acid represented by the formula (1c), and β-hydroxyisobutyric acid represented by the formula (1d) which may be used alone or in combination of two or more.

[Chemical formula 4]

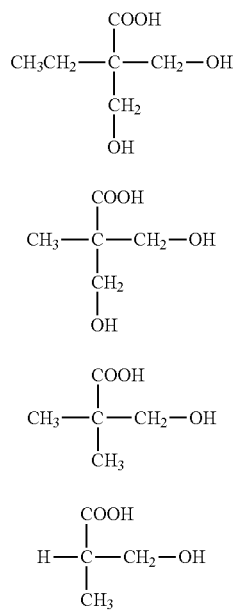

Exemplary compounds represented by the formula (2) include 2-hydroxy-2-methyl-n-butyric acid represented by the formula (2a), 2-hydroxyisobutyric acid represented by the formula (2b), glycolic acid represented by the formula (2c), and DL-2-hydroxybutyric acid represented by the formula (2d), which may be used alone or in combination of two or more.

[Chemical formula 5]

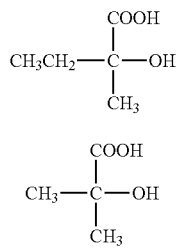

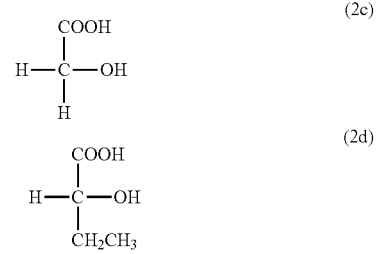

Exemplary compounds represented by the formula (3) include DL-3-hydroxybutyric acid represented by the formula (3a) and β-hydroxyvaleric acid represented by the formula (3b), which may be used alone or in combination of two or more.

[Chemical formula 6]

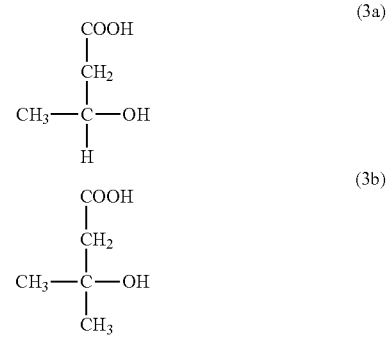

Among these, the fatty acid is preferably at least one member selected from 2,2-bis(hydroxymethyl)-n-butyric acid, 2,2-bis(hydroxymethyl)propionic acid, and hydroxypivaloic acid in view of the reduced time required for the formation of the electroconductive film by using the electroconductive composition of the present invention containing at least one member selected from silver 2,2-bis(hydroxymethyl)-n-butyrate, silver 2,2-bis(hydroxymethyl)propionate, and silver hydroxypivaloate as the silver salt of a fatty acid (B), and more specifically to reduce the time required for the formation to the level of up to 5 minutes at a temperature of about 160° C.

On the other hand, the silver oxide used in the reaction as described above is silver oxide (I), namely, $Ag_2O$ as in the case of the silver oxide (A) used in the electroconductive composition of the present invention.

The silver salt of a fatty acid (B) used in the electroconductive composition of the present invention is preferably a compound obtained by reacting the fatty acid having at least hydroxy group and the silver oxide, namely, the compound represented by formula (I), (II), or (III) in the reaction formulas as described below.

This reaction is not particularly limited as long as the reaction represented by the following scheme is involved, for example, when the compound represented by the formulae (1), (2), or (3) is used, and the preferred methods include the one in which the reaction with the fatty acid proceeds along with the pulverization of the silver oxide and the one in which the reaction is conducted after pulverizing the silver oxide. In an exemplary process of the former method, the silver oxide and a solution of the fatty acid in a solvent are kneaded in a ball mill or the like so that the reaction proceeds at room temperature for about 1 to 24 hours, and preferably about 2 to 8 hours while the solid silver oxide is pulverized.

[Chemical formula 7]

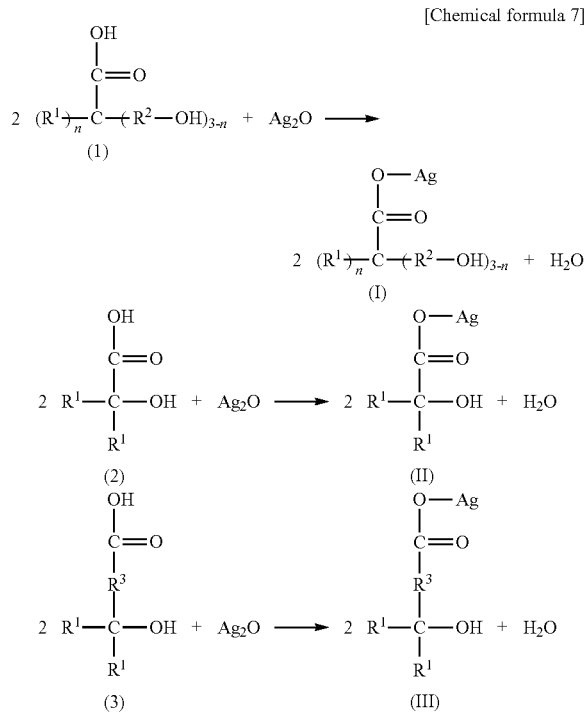

In the formula (I), n is an integer of 0 to 2, $R^1$ is hydrogen atom or an alkyl group containing 1 to 10 carbon atoms, and $R^2$ is an alkylene group containing 1 to 6 carbon atoms. When n is 0 or 1, the two or more $R^2$s may be either the same or different, and when n is 2, the two $R^1$s may be either the same or different.

In the formula (II), $R^1$ is independently hydrogen atom or an alkyl group containing 1 to 10 carbon atoms.

In the formula (III), $R^1$ is independently hydrogen atom or an alkyl group containing 1 to 10 carbon atoms, $R^3$ is an alkylene group containing 1 to 6 carbon atoms.

Exemplary solvents used for preparing the solution of the fatty acid include butyl carbitol, methyl ethyl ketone, isophorone, and α-terpineol, which may be used either alone or in combination of two or more.

Among these, use of isophorone and/or α-terpineol is preferable in view of the improved thixotropy of the electroconductive composition of the present invention containing the silver salt of a fatty acid (B) obtained by the reaction as described above.

In the present invention, use of the silver salt of a fatty acid (B) as described above has enabled to reduce the time required for the formation of the electroconductive film, and more specifically, formation of the electroconductive film in a period as short as up to 5 minutes at a temperature around 160° C., and this has also enabled to form a satisfactory electroconductive film on a substrate having a low heat resistance.

This is presumably the result of strong promotion of the decomposition (reduction) of the silver salt of a fatty acid (B) to the silver by the heat treatment due to the presence of the hydroxy group in the silver salt of a fatty acid (B). Results of thermogravimetric analysis (TGA) also demonstrate higher susceptibility to reduction of the silver salt of a fatty acid (B) compared to ternary silver salt of a fatty acid.

The electroconductive composition of the present invention is a composition containing the silver oxide (A) and the silver salt of a fatty acid (B) as described above, and in the composition, molar ratio (A/B) of the MOL A of the silver oxide (A) to the MOL B of the silver salt of a fatty acid (B) is preferably in the range of 2/1 to 25/1, and more preferably 2/1 to 15/1. When the molar ratio is within such range, the electroconductive film formed by using the resulting electroconductive composition will exhibit reduced specific resistivity.

If desired, the electroconductive composition of the present invention may further comprise silver salt of a secondary fatty acid produced by using a secondary fatty acid having a boiling point of up to 200° C. This is another preferred embodiment.

Next, this silver salt of a secondary fatty acid is described as a silver salt of a secondary fatty acid (C).

<Silver Salt of a Secondary Fatty Acid (C)>

The silver salt of a secondary fatty acid (C) is the one obtained by using a secondary fatty acid having a boiling point of up to 200° C., and more particularly, the one obtained by reacting the secondary fatty acid having a boiling point of up to 200° C. as described below with the silver oxide.

The secondary fatty acid used in the reaction producing the silver salt of a secondary fatty acid (C) is not particularly limited as long as it is a secondary fatty acid having a boiling point of up to 200° C., and exemplary such secondary fatty acids include those represented by the following formula (4):

[Chemical formula 8]

$$R^5-\underset{\underset{H}{|}}{\overset{\overset{R^4}{|}}{C}}-\overset{\overset{O}{\|}}{C}-OH \qquad (4)$$

wherein $R^4$ represents an alkyl group containing 1 to 6 carbon atoms, and $R^5$ represents an alkyl group containing 1 to 10 carbon atoms.

In the formula (4), exemplary alkyl groups containing 1 to 6 carbon atoms of $R^4$ include methyl group, ethyl group, n-propyl group, n-butyl group, n-pentyl group, and n-hexyl group, and $R^4$ is preferably methyl group or ethyl group.

In the formula (4), exemplary alkyl groups containing 1 to 10 carbon atoms of $R^5$ include the alkyl groups containing 1 to 6 carbon atoms of $R^4$, and also, n-heptyl group, n-octyl group, n-nonyl group, and n-decyl group. $R^5$ is preferably methyl group, ethyl group, or n-propyl group.

In the present invention, the exemplary carboxylic acids represented by the formula (4) include 2-methylpropanoic acid (also referred to as isobutyric acid), 2-methylbutanoic acid (also referred to as 2-methylbutyric acid), 2-methylpentanoic acid, 2-methylheptanoic acid, and 2-ethylbutanoic acid.

Of these carboxylic acids, the preferred are 2-methyl propanoic acid and 2-methylbutanoic acid since the formation of the electroconductive film formed by using the electroconductive composition of the present invention containing silver 2-methylpropanoate and silver 2-methylbutanoate can be accomplished at a lower temperature and shorter time.

On the other hand, the silver oxide used in the reaction of the silver salt of a secondary fatty acid (C) is the same as the silver oxide (A) used in the electroconductive composition of the present invention, namely, the silver oxide (I) which is $Ag_2O$.

The silver salt of a secondary fatty acid (C) is preferably the compound represented by the following formula (IV) in the following reaction formula wherein the secondary fatty acid having a boiling point of 200° C. as described above is reacted with silver oxide.

This reaction is not particularly limited as long as the reaction proceeds, when the compound represented by the formula (4) is used, by the following reaction formula, and exemplary preferable methods include the method wherein the reaction is proceeded simultaneously with the pulverization of the silver oxide and the method wherein the reaction with the secondary fatty acid is conducted after the pulverization of the silver oxide. More specifically, in the former method, the silver oxide and the solution of the secondary fatty acid in a solvent are kneaded in a ball mill or the like, and the reaction is promoted at room temperature for about 1 to 24 hours, and preferably for 2 to 8 hours while the solid silver oxide is pulverized.

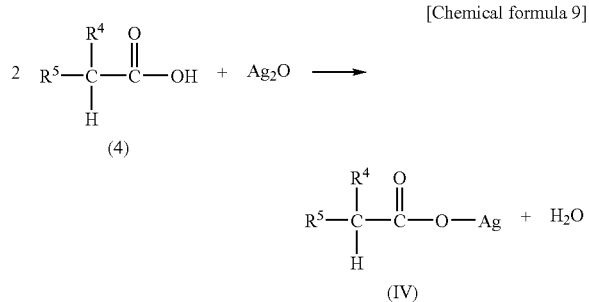

[Chemical formula 9]

In the formula (IV), $R^4$ represents an alkyl group containing 1 to 6 carbon atoms, and $R^5$ represents an alkyl group containing 1 to 10 carbon atoms.

Exemplary solvents which may be used in dissolving the secondary fatty acid include butyl carbitol, methyl ethyl ketone, and isophorone, α-terpineol, which may be used alone or in combination of two or more.

Of these solvents, the preferred are isophorone and/or α-terpineol in view of the improved thixotropy of the electroconductive composition of the present invention containing the silver salt of a secondary fatty acid (C).

In the present invention, an electroconductive film exhibiting low specific resistivity can be formed in a short time and at a low temperature by using a electroconductive composition containing the silver salt of a secondary fatty acid (C), and hence, an electroconductive film can be favorably formed on a substrate having a low heat resistance.

More specifically, an electroconductive film having a specific resistivity of up to $10 \times 10^{-6} \Omega$ can be formed at a temperature of about 160° C. in about 1 minute.

This is presumably because the silver salt of a secondary fatty acid (C) is readily decomposed by heat treatment, and the secondary fatty acid generated by the decomposition or the decomposition product thereof is easily volatilizable. Results of thermogravimetric analysis (TGA) also demonstrate higher susceptibility to reduction of the silver salt of a fatty acid (C) compared to ternary silver salt of a fatty acid.

In the present invention, when the composition contains the silver salt of a secondary fatty acid (C), molar ratio (B/C) of the MOL B of the silver salt of a fatty acid (B) to the MOL C of the silver salt of a secondary fatty acid (C) is in the range of 1/1 to 15/1, and more preferably 3/1 to 15/1. When the molar ratio is within such range, the electroconductive film produced by using the electroconductive composition has a lower specific resistivity.

Because of the same reason, molar ratio (A/B+C) of the MOL A of the silver oxide (A) to the total of the MOL B of the silver salt of a fatty acid (B) and the MOL C of the silver salt of a secondary fatty acid (C) is in the range of 2/1 to 25/1, and more preferably 2/1 to 15/1.

The electroconductive composition of the present invention may further include a film forming resin. This is another preferred embodiment.

Exemplary such film forming resins include epoxy resin, urethane resin, silicone resin, polyesterurethane resin, silicone modified acrylic resin, and phenol resin.

Of these resins, the preferred are polyester urethane resins in view of the capability of forming the electroconductive film exhibiting good adhesion at a low content, and ease of maintaining the low specific resistivity of the electroconductive composition of the present invention.

Next, this polyesterurethane resin is described in detail as the polyesterurethane resin (D).

<Polyesterurethane Resin (D)>

The polyesterurethane resin (D) is the one produced by reacting the polyisocyanate compound and the polyester polyol.

Examples of such polyisocyanate compound include aromatic isocyanates such as TDI (for example, 2,4-tolylene diisocyanate (2,4-TDI) and 2,6-tolylene diisocyanate (2,6-TDI)), MDI (for example, 4,4'-diphenylmethanediisocyanate (4,4'-MDI), 2,4'-diphenylmethanediisocyanate (2,4'-MDI)), 1,4-phenylene diisocyanate, polymethylene polyphenylene polyisocyanate, xylylene diisocyanate (XDI), tetramethylxylylene diisocyanate (TMXDI), tolidine diisocyanate (TODI), 1,5-naphthalene diisocyanate (NDI), and triphenylmethane triisocyanate; aliphatic polyisocyanates such as hexamethylene diisocyanate (HDI), trimethylhexamethylene diisocyanate (TMHDI), lysine diisocyanate, and norbornane diisocyanate (NBDI); alicyclic polyisocyanates such as transcyclohexane-1,4-diisocyanate, isophorone diisocyanate (IPDI), bis(isocyanate methyl)cyclohexane ($H_6XDI$), and dicyclohexyl methane diisocyanate ($H_{12}MDI$); carbodiimide-modified polyisocyanate thereof; and isocyanurate-modified polyisocyanate thereof.

The polyester polyol used is not particularly limited as long as it is a known polyol compound used in the production of a polyester. Exemplary such polyols include condensation polymer of at least one member selected from the group consisting of ethylene glycol, propylene glycol, butanediol, pentanediol, hexanediol, neopentyl glycol, glycerin, 1,1,1-trimethylolpropane, 1,4-cyclohexane dimethylol, 2,2-bishydroxymethyl-n-butyric acid, and other low molecular weight polyols with at least one member selected from the group consisting of glutaric acid, adipic acid, pimelic acid, suberic acid, sebacic acid, dimer acid, terephthalic acid, isophthalic acid, m-phthalic acid, naphthalene dicarboxylic acid, and other aliphatic carboxylic acid and oligomer acid; ring-opening polymer such as propione lactone and valerolactone.

In the present invention, exemplary combinations of the polyisocyanate compound and the polyester polyol used in producing the polyesterurethane resin (D) include diphenylmethanediisocyanate (MDI) or isophoronediisocyanate (IPDI) with 1,4-cyclohexane dimethylol, pentyl glycol, or 1,6-hexanediol.

In the present invention, the polyisocyanate compound and the polyester polyol used in producing the polyesterurethane resin (D) are preferably used at the NCO group/OH group ratio (equivalent ratio) of 1.2 to 2.5, and more preferably at 1.5 to 2.2. When they are used at the ratio within such range, the resulting polyesterurethane resin (D) will have an adequate viscosity, and the amount of polyisocyanate compound remaining in the polyesterurethane resin (D) will be reduced.

The method used in the present invention in producing the polyesterurethane resin (D) is not particularly limited, and in an exemplary method, the polyesterurethane resin (D) may be produced by agitating the polyisocyanate compound and the polyester polyol at the equivalent ratio as described above 50 to 130° C. If desired, the production may be accomplished by using a urethane formation catalyst such as organotin compound, organobismuth, or an amine.

In the present invention, the polyesterurethane resin (D) preferably has a glass transition temperature (Tg) of at least 60° C., and more preferably 80 to 100° C.

When the glass transition temperature is within such range, strength of the resulting film comprising the electroconductive composition of the present invention at high temperature will be maintained at a high level.

In the present invention, the polyesterurethane resin (D) may also preferably have an acid value of up to 30, and more preferably 5 to 20.

The term "acid value" used herein means amount (mg) of potassium hydroxide required for neutralizing the free fatty acid in the polyesterurethane resin (D).

When the acid value is within such range, the resulting electroconductive composition of the present invention will exhibit further improved adhesion to the underlying substrate.

Furthermore, the content of the polyesterurethane resin (D) in the present invention is preferably in the range of 0.5 to 10 parts by mass, and more preferably 0.5 to 5 parts by mass in relation to 100 parts by mass in total of the silver oxide (A), the silver salt of a fatty acid (B), and the silver salt of a secondary fatty acid (C).

When the content of the polyesterurethane resin (D) is within such range, the resulting electroconductive composition of the present invention will exhibit further improved adhesion to the substrate and the low specific resistivity will also be maintained.

In the present invention, the polyesterurethane resin (D) as described above may be a commercially available product.

Exemplary such commercially available products include Vylon™ UR series manufactured by TOYOBO, and more specifically, Vylon UR1700 (acid value: 26 KOH mg/g, Tg: 92° C.), Vylon UR (acid value: 13 KOH mg/g, Tg: 75° C.), Vylon UR (acid value: 7 KOH mg/g, Tg: 75° C.), Vylon UR (acid value: up to 1 KOH mg/g, Tg: 67° C.), and Vylon UR (acid value: 35 KOH mg/g, Tg: 90° C.).

In addition, incorporation of the polyesterurethane resin (D) in the present invention enables formation of the electroconductive film having an improved adhesion to the underlying substrate while maintaining the low specific resistivity.

This is presumably because the high adhesion to the substrate can be realized even if content of the polyesterurethane resin (D) is used at a low content. This merit is quite useful in view of the known film forming resins such as epoxy resin, since in such resins, while adhesion to the substrate can be can be improved by increasing the content of such resin, it would then become difficult to maintain the specific resistivity at the low level.

The electroconductive composition of the present invention may optionally contain an additive such as metal powder or reducing agent.

Examples of such metal powder include copper, silver, and aluminum, and among these, the preferred are copper and silver. The metal powder may preferably have a particle diameter of 0.01 to 10 μm.

Exemplary reducing agents include ethyleneglycols.

For the purpose of improving the adhesion, the electroconductive composition of the present invention may also contain a silver salt of a fatty acid such as silver neodecanoate other than the silver salt of a fatty acid (B) in addition to the silver salt of a fatty acid (B) at a molar content less than the silver salt of a fatty acid (B).

The method used for producing the electroconductive composition of the present invention is not particularly limited, and in an exemplary method, the silver oxide (A), the silver salt of a secondary fatty acid (B), and the optional silver salt of a secondary fatty acid (C), the polyesterurethane resin (D), and additives are mixed by a roll, kneader, extruder, universal agitator, or the like.

In the present invention, the silver oxide used in the reaction for producing the silver salt of a fatty acid (B) and the optional silver salt of a secondary fatty acid (C) are the same as the silver oxide (A), and therefore, the method used for producing the electroconductive composition of the present invention is not limited to the method in which the silver salt of a fatty acid (B) and the silver salt of a secondary fatty acid (C) which had been preliminarily synthesized are mixed with the silver oxide (A), and also included is the method in which an excessive amount of the silver oxide (A) is mixed with the fatty acid having at least one hydroxy group used in the reaction of producing the silver salt of a fatty acid (B) and the secondary fatty acid having a boiling point of up to 200° C. used in producing the silver salt of a secondary fatty acid (C) to thereby synthesize the silver salt of a fatty acid (B) and the silver salt of a secondary fatty acid (C) during the mixing.

The method for forming the electroconductive film of the present invention is the method comprising the steps of coating the electroconductive composition on a substrate to form a coating, and subjecting the coating to a heat treatment to produce the electroconductive film.

Next, the coating step and the heat treatment step are described in detail.

<Coating Step>

The coating step is the step of coating the electroconductive composition of the present invention on the substrate to thereby form a coating film.

The substrate used may be the substrate having a low heat resistance as mentioned above, or alternatively, a film of polyethylene naphthalate, polyimide, or the like; or a substrate such as a copper plate, a copper foil, a glass plate, an epoxy resin plate or a paper sheet.

The electroconductive composition of the present invention is coated on the substrate by the coating method as will be described below after the optional step of dissolving the composition in a solvent such as α-terpineol as mentioned above to thereby form the coating film.

The method used for the coating include ink jet printing, screen printing, gravure printing, offset printing, and relief printing.

<Heat Treatment Step>

The heat treatment step is the step in which the coating applied in the coating step is heat treated to produce the electroconductive film.

In the present invention, when the coating is heat treated, the silver salt of a fatty acid (B) and the optional silver salt of a secondary fatty acid (C) are decomposed to generate silver, and while most of the fatty acid or its decomposition product volatilizes, some of the fatty acid generated by the decomposition reacts with the silver oxide (A) to again generate the silver salt of the fatty acid (B) and the silver salt of the secondary fatty acid (C), and this silver salt of a secondary fatty acid (B) is reduced (namely, decomposed into the silver and the fatty acid) in the next cycle. The electroconductive film of the present invention (silver film) is formed by the repetition of such cycles.

The heat treatment carried out in the present invention is preferably the one conducted at a temperature of 100 to 250° C. for a period of several minutes to several dozen minutes, and more preferably the one conducted at about 160° C. for a period of up to 5 minutes. When the heat treatment is conducted at the temperature and for the period within such range, an electroconductive film which is adequate for use on a substrate having a low heat resistance can be produced since the electroconductive composition of the present invention contains the silver salt of a fatty acid (B) and the optional silver salt of a secondary fatty acid (C) as described above.

In the present invention, the coating formed in the coating step can also be converted to the electroconductive film by the cycles as described above by irradiating the coating with UV or infrared beam, and therefore, the heat treatment can also be conducted by such UV or infrared irradiation.

EXAMPLES

Next, the production method of the present invention is described by referring to the Examples which by no means limit the scope of the present invention.

Examples 1-1 to 1-5

Silver oxide (I) and silver 2,2-bis(hydroxymethyl)-n-butyrate were mixed in α-terpineol at the molar ratio shown in Table 1 to produce the electroconductive composition. The silver 2,2-bis(hydroxymethyl)-n-butyrate used was the one prepared by reacting 2,2-bis(hydroxymethyl)-n-butyric acid (a fatty acid) with silver oxide.

Next, the thus prepared electroconductive composition was coated on a PET film having a thickness of 100 μm (a substrate, Lumirror S56 manufactured by Toray Industries, Inc.) by screen printing to form a coating, and the coating was dried in an oven at 160° C. for 5 minutes to produce an electroconductive film.

Example 1-6

The procedure of Example 1-3 was repeated except that the silver 2,2-bis(hydroxymethyl)-n-butyrate was replaced with silver 2,2-bis(hydroxymethyl)propionate prepared by reacting 2,2-bis(hydroxymethyl)propionic acid (a fatty acid) with silver oxide to produce an electroconductive composition, and hence, an electroconductive film.

Example 1-7

The procedure of Example 1-3 was repeated except that the silver 2,2-bis(hydroxymethyl)-n-butyrate was replaced with silver hydroxypivalate prepared by reacting hydroxypivalic acid (a fatty acid) with silver oxide to produce an electroconductive composition, and hence, an electroconductive film.

Comparative Example 1-1

The procedure of Example 1-3 was repeated except that the silver 2,2-bis(hydroxymethyl)-n-butyrate was replaced with silver malonate prepared by reacting malonic acid (a fatty acid) with silver oxide to produce an electroconductive composition, and hence, an electroconductive film.

Comparative Example 1-2

The procedure of Example 1-3 was repeated except that the silver 2,2-bis(hydroxymethyl)-n-butyrate was replaced with silver propionate prepared by reacting propionic acid (a fatty acid) with silver oxide to produce an electroconductive composition, and hence, an electroconductive film.

Comparative Example 1-3

The procedure of Example 1-3 was repeated except that the silver 2,2-bis(hydroxymethyl)-n-butyrate was replaced with silver pivalate prepared by reacting pivalic acid (a fatty acid) with silver oxide to produce an electroconductive composition, and hence, an electroconductive film.

Comparative Example 1-4

The procedure of Example 1-3 was repeated except that the silver 2,2-bis(hydroxymethyl)-n-butyrate was replaced with silver n-butyrate prepared by reacting n-butyric acid (a fatty acid) with silver oxide to produce an electroconductive composition, and hence, an electroconductive film.

Comparative Example 1-5

The procedure of Example 1-3 was repeated except that the silver 2,2-bis(hydroxymethyl)-n-butyrate was replaced with silver neodecanoate prepared by reacting neodecanoate (a fatty acid) with silver oxide to produce an electroconductive composition, and hence, an electroconductive film.

The resulting electroconductive films were evaluated for their specific resistivity by the procedure as described below. The results are shown in Table 1.

<Specific Resistivity>

The electroconductive films obtained by drying at 160° C. for 5 minutes were evaluated for their specific resistivity (specific volume resistivity) by 4-terminal 4-probe method using a low resistivity meter (Loresta GP manufactured by Mitsubishi Chemical Corporation). The results are shown in Table 1, below.

In Table 1, "not available" means that the resistivity could not be measured because of the unfavorable condition of the electroconductive film.

TABLE 1

| | | Example | | | | | | |
|---|---|---|---|---|---|---|---|---|
| | | 1-1 | 1-2 | 1-3 | 1-4 | 1-5 | 1-6 | 1-7 |
| Silver oxide (mol) | | 1.00 | 1.00 | 1.00 | 1.00 | 1.00 | 1.00 | 1.00 |
| Silver salt of a fatty acid (mol) | Silver 2,2-bis (hydroxymethyl)-n-butyrate | 0.04 | 0.07 | 0.15 | 0.50 | 2.00 | | |
| | Silver 2,2bis (hydroxymethyl)propionate | | | | | | 0.15 | |
| | Silver hydroxypivalate | | | | | | | 0.15 |
| Silver oxide (mol)/silver salt of a fatty acid (mol) | | 25/1 | 15/1 | 6.6/1 | 2/1 | 0.5/1 | 6.6/1 | 6.6/1 |
| α-terpineol (g) | | 100 | 100 | 100 | 100 | 100 | 100 | 100 |
| Specific resistance (×10$^{-6}$ Ω · cm) | | 80.6 | 12.8 | 7.2 | 8.9 | 25.7 | 7.8 | 8.0 |

| | | Comparative Example | | | | |
|---|---|---|---|---|---|---|
| | | 1-1 | 1-2 | 1-3 | 1-4 | 1-5 |
| Silver oxide (mol) | | 1.00 | 1.00 | 1.00 | 1.00 | 1.00 |
| Silver salt of a fatty acid (mol) | Silver malonate | 0.15 | | | | |
| | Silver propionate | | 0.15 | | | |
| | Silver pivalate | | | 0.15 | | |
| | Silver n-butyrate | | | | 0.15 | |
| | Silver neodecanoate | | | | | 0.15 |
| Silver oxide (mol)/silver salt of a fatty acid (mol) | | 6.6/1 | 6.6/1 | 6.6/1 | 6.6/1 | 6.6/1 |
| α-terpineol (g) | | 100 | 100 | 100 | 100 | 100 |
| Specific resistance (×10$^{-6}$ Ω · cm) | | Not measurable | Not measurable | 160.8 | Not measurable | Not measurable |

As evident from the results shown in Table 1, when the electroconductive film was produced from the electroconductive compositions produced in Comparative Examples 1-1 to 1-5 containing the silver salt of a fatty acid without hydroxy group, the film condition of the electroconductive film was very poor and the specific resistivity was either unmeasurable or very high.

In contrast, it was found that, when the electroconductive compositions containing the silver salt of a fatty acid (B) having at least one hydroxy group produced in Examples 1-1 to 1-7 are used, an electroconductive film can be formed even if the coating was dried under the condition of 160° C. for 5 minutes. In particular, an electroconductive film having good specific resistivity could be produced by using the electroconductive compositions prepared in Examples 1-2 to 1-4, 1-6, and 1-7 having the molar ratio of the silver oxide to the silver salt of a fatty acid in the range of 2/1 to 15/1.

Examples 2-1 to 2-6

Silver oxide (I), silver 2,2-bis(hydroxymethyl)-n-butyrate, and silver 2-methylpropanoate (silver isobutyrate) were added to a ball mill at the molar ratio shown in Table 2, below. To the mixture, α-terpineol, stearic acid, and lauric acid were added at the amount (g) shown in Table 2, and the ingredients were mixed to prepare the electroconductive composition.

The silver 2,2-bis(hydroxymethyl)-n-butyrate used was the one prepared by reacting 2,2-bis(hydroxymethyl)-n-butyric acid (a fatty acid) with silver oxide. The silver 2-methylpropanoate used was the one prepared by reacting 2-methyl propanoic acid (isobutyric acid) (a fatty acid) with silver oxide. Number of substitution and boiling point of the isobutyric acid used in the reaction with the silver salt of a fatty acid are shown in Table 2, below.

Next, the thus prepared electroconductive composition was coated on a PET film having a thickness of 100 μm (a substrate, Lumirror S56 manufactured by Toray Industries, Inc.) by screen printing to form a coating, and the coating was dried in an oven at 160° C. for 1 minute to produce an electroconductive film.

Example 2-7

The procedure of Example 2-2 was repeated except that the silver 2,2-bis(hydroxymethyl)-n-butyrate was replaced with silver 2,2-bis(hydroxymethyl)propionate prepared by reacting 2,2-bis(hydroxymethyl)propionic acid (a fatty acid) with silver oxide to produce an electroconductive composition, and hence, an electroconductive film.

Example 2-8

The procedure of Example 2-2 was repeated except that the silver 2,2-bis(hydroxymethyl)-n-butyrate was replaced with silver hydroxypivalate prepared by reacting hydroxypivalic acid (a fatty acid) with silver oxide to produce an electroconductive composition, and hence, an electroconductive film.

Example 2-9

The procedure of Example 2-2 was repeated except that the silver 2-methylpropanoate was replaced with silver 2-methylbutanoate prepared by reacting 2-methylbutanoic acid (2-methylbutyric acid) (a fatty acid) with silver oxide to produce an electroconductive composition, and hence, an electroconductive film. Number of substitution and boiling point of the 2-methylbutanoic acid used in the reaction with the silver salt of a fatty acid are shown in Table 2, below.

Comparative Example 2-1

The procedure of Example 2-1 was repeated except that silver 2,2-bis(hydroxymethyl)-n-butyrate was replaced with twice molar amount of silver 2-methylpropanoate to produce an electroconductive composition, and hence, an electroconductive film.

Example 2-10

The procedure of Example 2-1 was repeated except that the silver 2-methylpropanoate was replaced with twice molar amount of silver 2,2-bis(hydroxymethyl)-n-butyrate to produce an electroconductive composition, and hence, an electroconductive film.

Comparative Example 2-2

The procedure of Example 2-1 was repeated except that the silver 2,2-bis(hydroxymethyl)-n-butyrate and silver 2-methylpropanoate were replaced with silver neodecanoate prepared by reacting neodecanoic acid (a fatty acid) with silver oxide at the molar ratio shown in Table 2 to produce an electroconductive composition, and hence, an electroconductive film. Number of substitution and boiling point of the neodecanoic acid used in the reaction with the silver salt of a fatty acid are shown in Table 2, below.

The resulting electroconductive films were evaluated for their specific resistivity by the following method. The results are shown in Table 2.

<Specific Resistivity>

The electroconductive films obtained by drying at 160° C. for 1 minute were evaluated for their specific resistivity (specific volume resistivity) by 4-terminal 4-probe method using a low resistivity meter (Loresta GP manufactured by Mitsubishi Chemical Corporation). The results are shown in Table 2, below.

In Table 2, "not available" means that the resistivity could not be measured because of the unfavorable condition of the electroconductive film.

TABLE 2

| | | | | | | Example | | | | | | |
|---|---|---|---|---|---|---|---|---|---|---|---|---|
| | | | 2-1 | 2-2 | 2-3 | 2-4 | 2-5 | 2-6 | 2-7 | 2-8 | 2-9 |
| (A) | Silver oxide (mol) | | 15.00 | 15.00 | 15.00 | 15.00 | 15.00 | 15.00 | 15.00 | 15.00 | 15.00 |
| (B) | Silver salt of a fatty acid (mol) | Silver 2,2-bis(hydroxymethyl)-n-butyrate | 1.00 | 1.50 | 1.765 | 1.82 | 1.875 | 1.90 | | | 1.50 |
| | | Silver 2,2-bis(hydroxymethyl)propionate | | | | | | | 1.50 | | |
| | | Silver hydroxypivalate | | | | | | | | 1.50 | |
| (C) | Silver salt of a fatty acid (mol) (number of substitution/ boiling point) | Silver 2 methylpropanoate (secondary/155° C.) | 1.00 | 0.50 | 0.235 | 0.18 | 0.125 | 0.10 | 0.50 | 0.50 | |
| | | Silver 2-methylbutanoate (secondary/177° C.) | | | | | | | | | 0.50 |
| Silver neodecanoate (mol) (tertiary/270° C.) | | | | | | | | | | | |
| Stearic acid (g) | | | 2 | 2 | 2 | 2 | 2 | 2 | 2 | 2 | 2 |
| Lauric acid (g) | | | 2 | 2 | 2 | 2 | 2 | 2 | 2 | 2 | 2 |
| α-terpineol (g) | | | 100 | 100 | 100 | 100 | 100 | 100 | 100 | 100 | 100 |
| Silver salt of a fatty acid (B) (mol)/silver salt of a fatty acid (C) (mol) | | | 1/1 | 3/1 | 7.5/1 | 10/1 | 15/1 | 19/1 | 3/1 | 3/1 | 3/1 |
| Specific resistivity (×$10^{-6}$ Ω·cm) | | | 7.1 | 6.0 | 6.2 | 6.6 | 6.9 | 9.8 | 6.5 | 6.4 | 6.5 |

| | | | Comparative Example | | Example |
|---|---|---|---|---|---|
| | | | 2-1 | 2-2 | 2-10 |
| (A) | Silver oxide (mol) | | 15.00 | 15.00 | 15.00 |
| (B) | Silver salt of a fatty acid (mol) | Silver 2,2 bis(hydroxymethyl)-n-butyrate | | | 1.00 |
| | | Silver 2,2-bis(hydroxymethyhl)propionate | | | |
| | | Silver hydroxypivalate | | | |
| (C) | Silver salt of a fatty acid (mol) (secondary/boiling point) | Silver 2-methylpropanoate (secondary/155° C.) | 2.00 | | |
| | | Silver 2-methylbutanoate (secondary/177° C.) | | | |
| Silver neodecanoate (mol) (tertiary/270° C.) | | | | 2.00 | |
| Stearic acid (g) | | | 2 | 2 | 2 |
| Lauric acid (g) | | | 2 | 2 | 2 |
| α-terpineol (g) | | | 100 | 100 | 100 |
| Silver salt of a fatty acid (B) (mol)/Silver salt of a fatty acid (C) (mol) | | | 0/2 | — | 2/0 |
| Specific resistivity (×$10^{-6}$ Ω·cm) | | | Not measurable | Not measurable | 11.2 |

As evident from the results shown in Table 2, when the electroconductive film was produced from the electroconductive compositions not containing the silver salt of a fatty acid (B) having at least one hydroxy group and/or the silver salt of a secondary fatty acid (C) having a boiling point of up to 200° C. produced by using a secondary fatty acid (Comparative Examples 2-1 to 2-2), the film condition of the electroconductive film after drying at 160° C. for 1 minute was very poor and the specific resistivity was unmeasurable.

In contrast, it was found that, when the electroconductive compositions containing the silver salt of a fatty acid (B) having at least one hydroxy group and silver salt of a secondary fatty acid (C) having a boiling point of up to 200° C. produced in Examples 2-1 to 2-10 were used, an electroconductive film having low specific resistivity can be formed even if the coating was dried under the condition of 160° C. for 1 minute. In particular, an electroconductive film having good specific resistivity could be produced by using the electroconductive composition prepared in Examples 2-1 to 2-5 and 2-7 to 2-9 having the molar ratio (B/C) of the silver oxide (B) to the silver salt of a fatty acid (C) in the range of 1/1 to 15/1.

Examples 2-11 and 2-12

The procedure of Example 2-2 was repeated except that Vylon UR1700 (acid value: 26 KOH mg/g, Tg: 92° C., manufactured by TOYOBO) was also added as a polyesterurethane resin (D) to produce an electroconductive composition, and hence, an electroconductive film.

In this process, the polyester resin (D) was added at an amount of 0.5 parts by mass in Example 2-11, and at 5.0 parts by mass in Example 2-11 in relation to the 100 parts by weight of the total content of the silver oxide (A), the silver salt of a fatty acid (B), and the silver salt of a secondary fatty acid (C).

The resulting electroconductive films were evaluated for their specific resistivity by the method as described above, and for the adhesion by the method as described below. The results are shown in Table 3.

<Adhesion>

The resulting electroconductive films were evaluated for their adhesion to the PET film by cross cut peeling test.

More specifically, the substrate coated by the electroconductive film was formed with cross cuts in both length and breadth directions at an interval of 1 mm to form 100 (10×10) squares. An adhesive tape was thoroughly applied on the cross cut surface, and the surface was rubbed with the finger for 10 times, and then, the adhesive tape was instantaneously peeled with one end of the tape being held in the direction perpendicular to the substrate. The number of the remaining squares was counted. The most favorable case is the case in which the number of the remaining squares is 100 (namely, the case in which no square is peeled).

TABLE 3

|  | Example | |
| --- | --- | --- |
|  | 2-11 | 2-12 |
| Specific example (×10⁻⁶ Ω·cm) | 7.8 | 8.1 |
| Adhesion | 100/100 | 100/100 |

As evident from the results shown in Table 3, when the electroconductive film is produced from the electroconductive composition containing the polyesterurethane resin (D) (Examples 2-11 and 2-12), the electroconductive film having a low specific resistivity with good adhesion to the underlying substrate can be formed even if the coating is dried under the condition of 160° C. for 1 minute.

The invention claimed is:

1. An electroconductive composition comprising silver oxide (A) and silver salt of a fatty acid (B) containing at least one hydroxy group, wherein the silver salt of a fatty acid (B) is a compound represented by any one of the following formulae (I) to (III):

[chemical formula 1]

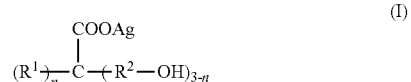

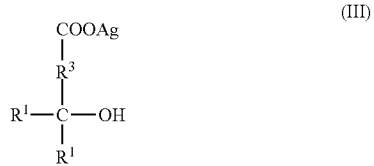

wherein, in formula (I), n represents an integer of 0 to 2, $R^1$ respectively represents hydrogen atom or an alkyl group containing 1 to 10 carbon atoms, and $R^2$ independently represents an alkylene group containing 1 to 6 carbon atoms, with the proviso that, when n is 0 or 1, the two or more $R^2$s may be either the same or different, and when n is 2, the $R^1$s may be either the same or different, in formula (II), $R^1$ independently represents hydrogen atom or an alkyl group containing 1 to 10 carbon atoms, and in formula (III), $R^1$ independently represents hydrogen atom or an alkyl group containing 1 to 10 carbon atom, and $R^3$ represents an alkylene group containing 1 to 6 carbon atoms.

2. The electroconductive composition according to claim 1 wherein the silver salt of a fatty acid (B) contains at least two hydroxy groups.

3. The electroconductive composition according to claim 1 wherein molar ratio (A/B) of the MOL A of the silver oxide (A) to the MOL B of the silver salt of a fatty acid (B) is in the range of 2/1 to 25/1.

4. The electroconductive composition according to claim 1 wherein the silver salt of a fatty acid (B) is at least one member selected from silver 2,2-bis(hydroxymethyl)-n-butyrate, silver 2,2-bis(hydroxymethyl)propionate, and silver hydroxypivalate.

5. The electroconductive composition according to claim 1 wherein the composition further comprises silver salt of a secondary fatty acid (C) having a boiling point of up to 200° C.

6. The electroconductive composition according to claim 5 wherein molar ratio (B/C) of the MOL B of the silver salt of a fatty acid (B) to the MOL C of the silver salt of a secondary fatty acid (C) is in the range of 1/1 to 15/1.

7. The electroconductive composition according to claim 5 wherein the silver salt of a secondary fatty acid (C) is a compound represented by the following formula (IV):

[chemical formula 2]

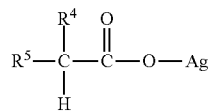

(IV)

wherein $R^4$ is an alkyl group containing 1 to 6 carbon atoms, and $R^5$ is an alkyl group containing 1 to 10 carbon atoms.

8. The electroconductive composition according to claim 5 wherein the silver salt of a secondary fatty acid (C) is silver 2-methylpropanoate and/or silver 2-methylbutanoate.

9. The electroconductive composition according to claim 1 wherein the composition further comprises a polyesterurethane resin (D).

10. The electroconductive composition according to claim 9 wherein the polyesterurethane resin (D) has a glass transition temperature of at least 60° C.

11. The electroconductive composition according to claim 9 wherein the polyesterurethane resin (D) has an acid value of up to 30.

12. The electroconductive composition according to claim 9 wherein content of the polyesterurethane resin (D) is in the range of 0.5 to 10 parts by weight in relation to the 100 parts by weight of the total content of the silver oxide (A), the silver salt of a fatty acid (B), and the silver salt of a secondary fatty acid (C).

13. A method for forming an electroconductive film comprising the steps of coating the electroconductive composition of claim 1 on a substrate to form a coating, and subjecting the coating to a heat treatment to produce the electroconductive film.

14. A method for forming an electroconductive film according to claim 13 wherein the heat treatment is conducted by heating to a temperature of 100 to 250° C.

\* \* \* \* \*